(12) United States Patent
Ward et al.

(10) Patent No.: US 7,911,161 B2
(45) Date of Patent: Mar. 22, 2011

(54) AUTOMOTIVE POWER INVERTER WITH REDUCED CAPACITIVE COUPLING

(75) Inventors: Terence G. Ward, Redondo Beach, CA (US); Gregory Scott Smith, Woodland Hills, CA (US); George John, Cerritos, CA (US); Tilak Gopalarathnam, Torrance, CA (US); David F. Nelson, Redondo Beach, CA (US)

(73) Assignee: GM Global Technology Operations LLC, Detroit, MI (US)

( * ) Notice: Subject to any disclaimer, the term of this patent is extended or adjusted under 35 U.S.C. 154(b) by 718 days.

(21) Appl. No.: 11/769,772

(22) Filed: Jun. 28, 2007

(65) Prior Publication Data
US 2009/0001909 A1    Jan. 1, 2009

(51) Int. Cl.
*H02P 1/00* (2006.01)
(52) U.S. Cl. ............ 318/139; 318/801; 310/54; 361/55; 361/699; 439/196
(58) Field of Classification Search .................. 318/139, 318/801; 361/55, 699; 310/54; 439/196
See application file for complete search history.

(56) References Cited

U.S. PATENT DOCUMENTS

| | | | |
|---|---|---|---|
| 5,768,103 A | 6/1998 | Kobrinetz et al. | |
| 5,943,211 A * | 8/1999 | Havey et al. | 361/699 |
| 6,219,245 B1 * | 4/2001 | Nagashima et al. | 361/705 |
| 6,230,791 B1 * | 5/2001 | Van Dine et al. | 165/80.4 |
| 6,349,554 B2 * | 2/2002 | Patel et al. | 62/259.2 |
| 6,411,514 B1 | 6/2002 | Hussaini | |
| 7,043,933 B1 * | 5/2006 | Knight | 62/259.2 |
| 7,180,741 B1 * | 2/2007 | Knight et al. | 361/699 |
| 7,210,304 B2 * | 5/2007 | Nagashima et al. | 62/259.2 |
| 7,450,378 B2 * | 11/2008 | Nelson et al. | 361/689 |
| 7,477,513 B1 * | 1/2009 | Cader et al. | 361/699 |
| 7,481,072 B2 * | 1/2009 | Ostrom et al. | 62/243 |
| 7,558,064 B2 * | 7/2009 | Nakamura et al. | 361/698 |
| 7,679,234 B1 * | 3/2010 | Tilton et al. | 310/54 |
| 2008/0225482 A1 * | 9/2008 | Smith et al. | 361/699 |

FOREIGN PATENT DOCUMENTS

CN    1810557 A    8/2006

\* cited by examiner

*Primary Examiner* — Walter Benson
*Assistant Examiner* — Kawing Chan
(74) *Attorney, Agent, or Firm* — Ingrassia Fisher & Lorenz, P.C.

(57) ABSTRACT

An automotive power inverter is provided. The power inverter includes a chassis, a microelectronic die coupled to the chassis and having an integrated circuit formed thereon, and an insulating region between the chassis and the microelectronic die.

20 Claims, 3 Drawing Sheets

AUTOMOTIVE POWER INVERTER WITH REDUCED CAPACITIVE COUPLING

TECHNICAL FIELD

The present invention generally relates to automotive power inverters, and more particularly relates to an automotive power inverter with reduced capacitive coupling.

BACKGROUND OF THE INVENTION

The electric motors, as well as other components, used in alternative fuel vehicles, such as hybrid and fuel cell vehicles, often utilize alternating current (AC) power supplies. However, the power sources, such as batteries and fuel cells, used in such applications only provide direct current (DC) power. Thus, devices known as power inverters are used to convert the DC power to AC power.

Modern automotive power inverters often utilize power modules (or microelectronic die), which include integrated circuits with multiple semiconductor devices (e.g., transistors and diodes) formed thereon, to convert the DC power to AC power. Due to the high amounts of current used, the power modules generate large amounts of heat. In order to ensure reliable performance, the power inverters also include cooling systems to transfer heat away from the power modules.

Conventional cooling systems used in automotive inverters often include a metal heat sink, or cold plate (i.e., with a coolant flowing therethrough), connected directly to the chassis of the inverter. The power modules are usually mounted to a stack of various substrates and/or a base plate, which is attached to the heat sink. Heat from the power modules is conducted through substrates and/or baseplate into the heat sink, where it is removed from the inverter. The heat sink may also be used to cool other electronic components within the chassis of the inverter, such as busbars, inductors and capacitors.

When the power modules are operated, capacitive coupling between the power modules and the chassis occurs, and electromagnetic interference (EMI) currents are injected into the chassis, which can adversely affect the performance of the inverter and the motor. Thus, "Y-caps," or Y-capacitors, are often installed at the DC power inputs to the inverter to reduce the effects of the capacitive coupling and the EMI currents, thus increasing the costs of manufacturing.

Accordingly, it is desirable to provide an inverter assembly with a reduced capacitance between the chassis and the power modules. Furthermore, other desirable features and characteristics of the present invention will become apparent from the subsequent detailed description and the appended claims, taken in conjunction with the accompanying drawings and the foregoing technical field and background.

SUMMARY OF THE INVENTION

An automotive power inverter is provided. The automotive power inverter includes a chassis, a microelectronic die coupled to the chassis having a plurality of power electronic switches formed thereon, and an insulating region having a thickness of at least 1 mm between the chassis and the microelectronic die.

An automotive drive system is also provided. The automotive drive system includes a direct current (DC) power supply, an electric motor coupled to the DC power supply, and a power inverter coupled to the electric motor and to the DC power supply to receive DC power from the DC power supply and provide alternating current (AC) power to the electric motor. The power inverter includes a chassis comprising a conductive material, a housing connected to the chassis, the housing comprising an insulating material and forming a chamber, a microelectronic die connected to the housing within the chamber, the microelectronic die having an integrated circuit with at least one transistor formed thereon, a nozzle connected to the housing within the chamber and directed at the microelectronic die to spray a cooling fluid onto the microelectronic die to remove heat from the microelectronic die during operation thereof, and an insulating region between the chassis and the microelectronic die.

DESCRIPTION OF THE DRAWINGS

The present invention will hereinafter be described in conjunction with the following drawing figures, wherein like numerals denote like elements.

DESCRIPTION OF AN EXEMPLARY EMBODIMENT

The following detailed description is merely exemplary in nature and is not intended to limit the invention or the application and uses of the invention. Furthermore, there is no intention to be bound by any expressed or implied theory presented in the preceding technical field, background, and brief summary, or the following detailed description.

The following description refers to elements or features being "connected" or "coupled" together. As used herein, unless expressly stated otherwise, "connected" means that one element/feature is directly joined to (or directly communicates with) another element/feature, and not necessarily mechanically. Likewise, unless expressly stated otherwise, "coupled" means that one element/feature is directly or indirectly joined to (or directly or indirectly communicates with) another element/feature, and not necessarily mechanically. However, it should be understood that although two elements may be described below, in one embodiment, as being "connected," in alternative embodiments similar elements may be "coupled," and vice versa. Thus, although the schematic diagrams shown herein depict example arrangements of elements, additional intervening elements, devices, features, or components may be present in an actual embodiment. It should also be understood that FIGS. 1-5 are merely illustrative and may not be drawn to scale.

FIG. 1 to FIG. 5 illustrate a power inverter and an automotive drive system that includes the power inverter. The power inverter includes a chassis, a microelectronic die having an integrated circuit formed thereon, the microelectronic die being coupled to the chassis, and an insulating region between the chassis and the microelectronic die to reduce a capacitance between the chassis and the microelectronic die.

The power inverter may also include a cooling mechanism that allows for the inverter to be arranged such that the capacitance between the chassis and the microelectronic die is minimized. The cooling mechanism may not be a heat sink electrically connected directly to the chassis. The insulating region may include an air gap and/or an insulating body.

Figure 1:
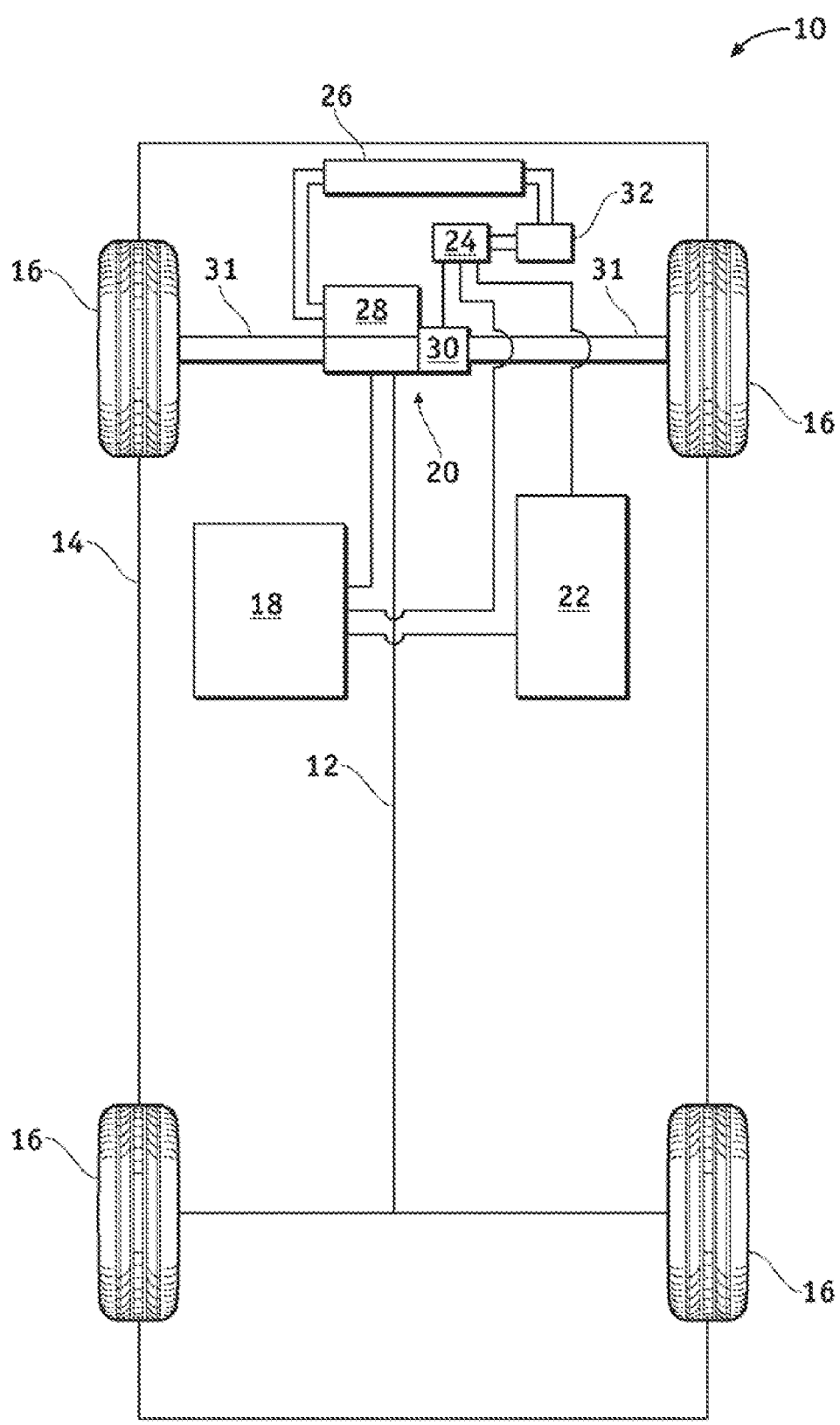
FIG. 1 is a schematic view of an exemplary automobile according to one embodiment of the present invention.

FIG. 1 illustrates a vehicle (or automobile) 10 according to one embodiment of the present invention. The automobile 10 includes a chassis 12, a body 14, four wheels 16, and an electronic control system 18. The body 14 is arranged on the chassis 12 and substantially encloses the other components of the automobile 10. The body 14 and the chassis 12 may jointly form a frame. The wheels 16 are each rotationally coupled to the chassis 12 near a respective corner of the body 14.

The automobile 10 may be any one of a number of different types of automobiles, such as, for example, a sedan, a wagon, a truck, or a sport utility vehicle (SUV), and may be two-wheel drive (2WD) (i.e., rear-wheel drive or front-wheel drive), four-wheel drive (4WD) or all-wheel drive (AWD). The vehicle 10 may also incorporate any one of, or combination of, a number of different types of engines, such as, for example, a gasoline or diesel fueled combustion engine, a "flex fuel vehicle" (FFV) engine (i.e., using a mixture of gasoline and alcohol), a gaseous compound (e.g., hydrogen and/or natural gas) fueled engine, a combustion/electric motor hybrid engine, and an electric motor.

In the exemplary embodiment illustrated in FIG. 1, the automobile 10 is a hybrid vehicle, and further includes an actuator assembly 20, a battery 22, a power inverter assembly (or inverter) 24, and a radiator 26. The actuator assembly 20 includes a combustion engine 28 and an electric motor/generator (or motor) 30. As will be appreciated by one skilled in the art, the electric motor 30 includes a transmission therein, and although not illustrated also includes a stator assembly (including conductive coils), a rotor assembly (including a ferromagnetic core), and a cooling fluid (i.e., coolant).

Still referring to FIG. 1, in one embodiment, the combustion engine 28 and the electric motor 30 are integrated such that both are mechanically coupled to at least some of the wheels 16 through one or more drive shafts 31. The radiator 26 is connected to the frame at an outer portion thereof and although not illustrated in detail, includes multiple cooling channels therethough that contain a cooling fluid (i.e., coolant) such as water and/or ethylene glycol (i.e., "antifreeze") and is coupled to the engine 28 and the inverter 24. In the depicted embodiment, the inverter 24 receives and shares coolant with the electric motor 30, and the radiator 26 is similarly connected to the inverter 24 and the electric motor 30 through a pump 32.

The electronic control system 18 is in operable communication with the actuator assembly 20, the battery 22, and the inverter 24. Although not shown in detail, the electronic control system 18 includes various sensors and automotive control modules, or electronic control units (ECUs), such as an inverter control module and a vehicle controller, and at least one processor and/or a memory which includes instructions stored thereon (or in another computer-readable medium) for carrying out the processes and methods as described below. It should be understood that the inverter control module may also be integrated into the power inverter assembly 24.

Figure 2:
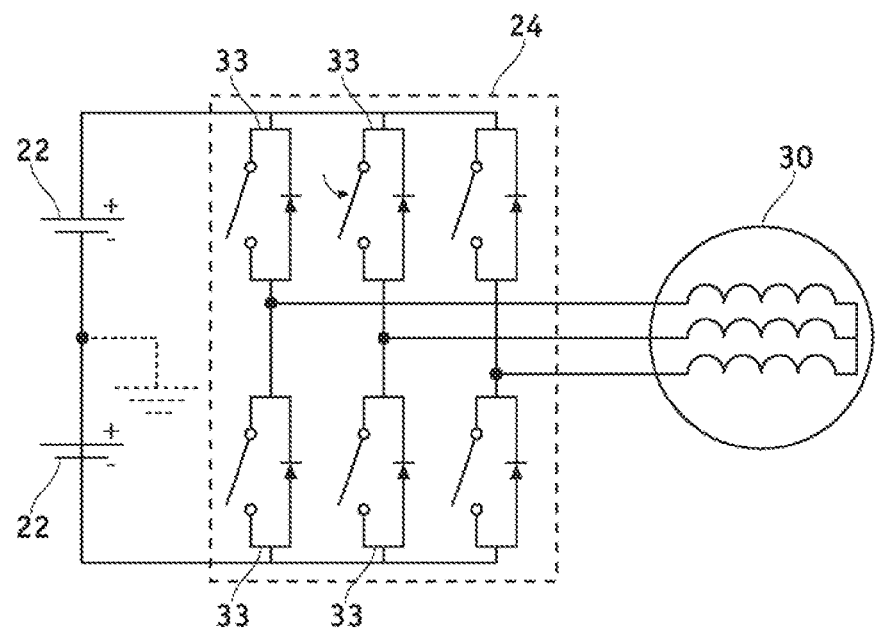
FIG. 2 is a schematic view of an inverter within the automobile of FIG. 1.
Figure 3:
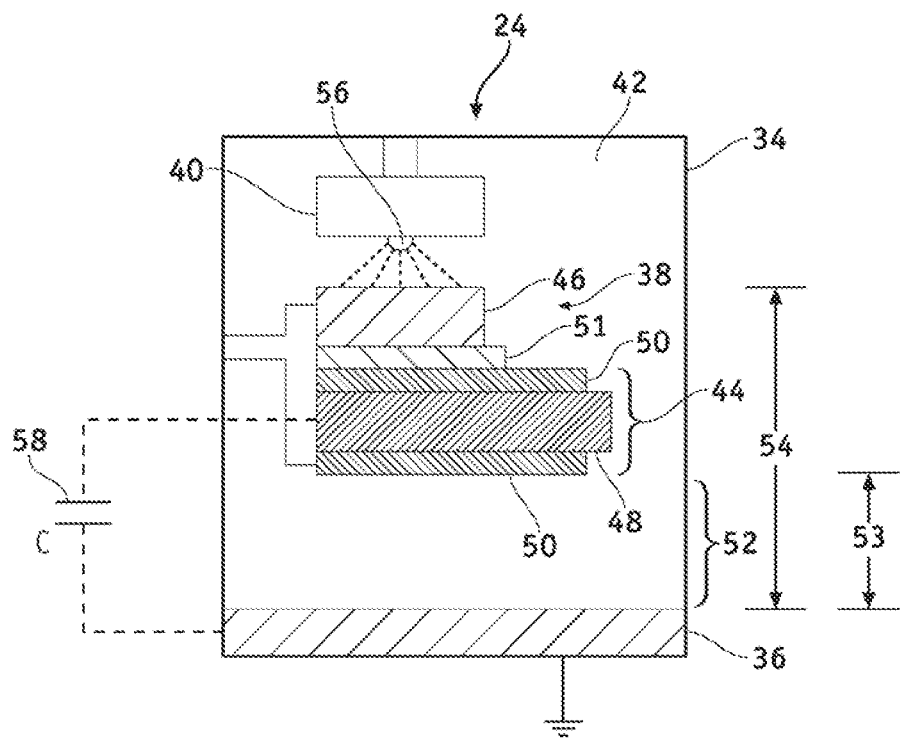
FIG. 3 is a cross-sectional side view of the inverter of FIG. 2, according to one embodiment of the present invention.

FIGS. 2 and 3 illustrate the inverter 24, according to one embodiment, in greater detail. As shown schematically in FIG. 2, the inverter 24 includes three pairs of series switches 33 coupled to the battery 22 and the electric motor 30. Referring to FIG. 3, the inverter 24 also includes, amongst other components, a housing 34, a chassis 36 connected to and/or within the housing 34, a module stack 38, and an atomizer 40. The housing 34 may be made of a molded plastic material and enclose a module chamber 42. The chassis 36 may be made of a metal, such as aluminum, and although not shown may form a frame around various other components of the inverter 24, such as a capacitor assembly that includes a set, or sets, of conductive plates, in a spaced relationship and wound into coils to form a capacitor, or multiple capacitors, as in commonly understood.

The module stack 38 is connected to the housing 34 and includes a direct, or double, bonded copper (DBC) substrate 44 and an electronic component, or microelectronic die 46. The DBC substrate 44 includes a ceramic core 48 and two copper layers 50 formed on opposing sides (i.e., upper and lower) of the ceramic core 48. The microelectronic die 46 includes a semiconductor substrate (e.g., silicon substrate) with an integrated circuit formed thereon that includes one or more of the switches 33 (e.g., power electronic switches) shown in FIG. 2 in the form of individual semiconductor devices, such as insulated gate bipolar transistors (IGBTs), as is commonly understood. The microelectronic die 46 is mounted to the copper layer 50 on the upper side of the ceramic core 48 of the DBC substrate 44 with solder 51.

In the embodiment illustrated in FIG. 3, the module stack 38 is positioned in a spaced relationship from the chassis 36 with an insulator (or insulating region) 52 having a thickness 53 formed therebetween. In one embodiment, the thickness 53 of the insulator 52 is at least 1 millimeter (mm), such as between 1 mm and 125 mm. The module stack 38 may be positioned such that the microelectronic die 46 lies a distance 54 from the chassis 36 that is greater than the thickness 53 of the insulator 52 (e.g., 2-3 mm greater than the thickness 53). The insulator 52 may include an air gap that extends between the chassis 36 and the copper layer 50 on the lower side of the ceramic core 48 of the DBC substrate 44. As such, in the embodiment depicted in FIG. 3, the module stack 38 is insulated from the chassis 36. It should also be noted that the embodiment shown in FIG. 3 does not include a heat sink or cold plate. In particular, the inverter 24 does not include a heat sink interconnecting the chassis 36 and the module stack 38.

Still referring to FIG. 3, the atomizer 40 (i.e., a cooling mechanism) is connected to the housing 34 within the module chamber 42 (and is electrically insulated from the chassis 36) and positioned above the module stack 38, and more particularly, above the microelectronic die 46. The atomizer 40 includes a nozzle 56 that is directed towards the microelectronic die 46, and although not specifically illustrated, is in fluid communication with the radiator 26, through the pump 32, shown in FIG. 1.

During operation, still referring to FIG. 1, the vehicle 10 is operated by providing power to the wheels 16 with the combustion engine 28 and the electric motor 30 in an alternating manner and/or with the combustion engine 28 and the electric motor 30 simultaneously. In order to power the electric motor 30, DC power is provided from the battery 22 to the inverter assembly 24, which converts the DC power into AC power, before the power is sent to the electric motor 30. As will be appreciated by one skilled in the art, the conversion of DC power to AC power is substantially performed by operating (i.e., repeatedly switching) the switches 33 (i.e., transistors) shown in FIG. 2.

With continued reference to FIG. 3, as the inverter 24 is operated, heat is generated by the semiconductor devices (i.e., transistors) within the microelectronic die 46. In one embodiment, the die 46 generates a heat flux density of at least 10 W/cm$^2$. In order to remove heat from the microelectronic die 46, the fluid within the radiator 26 is circulated by the pump 32 (FIG. 1) to the atomizer 40 within the inverter 24. The fluid is sprayed through the nozzle 56 onto the microelectronic die 46. Heat from the microelectronic die 46 conducts to the fluid before the fluid runs off of the microelectronic die 46. The fluid may then fall from the module stack 38 to be collected and returned to the radiator 26, by the pump 32, to be cooled within the cooling channels of the radiator 26.

Still referring to FIG. 3, as the microelectronic die 46 is operated, due to the lack of direct connection and the air gap, as well as the relatively large distance between the module stack 38 (or the microelectronic die 46) and the chassis 36, the capacitance 58 between the microelectronic die 46 and the chassis 36 is minimized.

Figure 4:
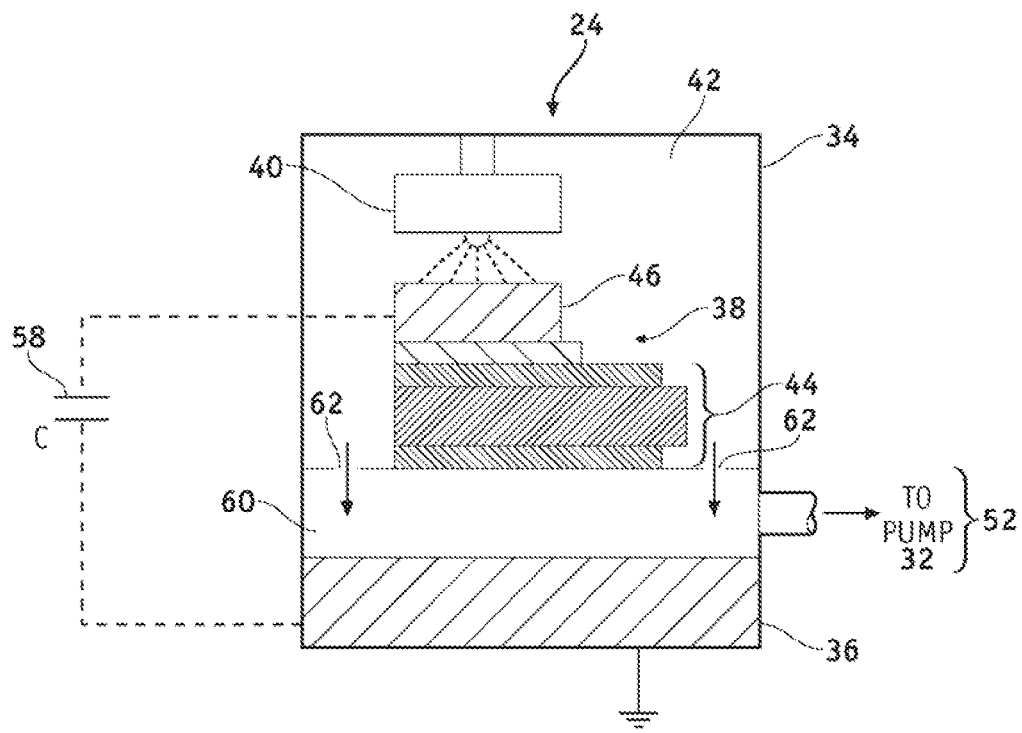
FIG. 4 is a cross-sectional side view of the inverter of FIG. 2, according to another embodiment of the present invention.

FIG. 4 illustrates the inverter 24, according to another embodiment. Similarly to inverter 24 shown in FIG. 3, the inverter 24 includes a housing 34, a chassis 36, a module stack 38, and an atomizer 40. However, the inverter 24 shown in FIG. 4 also includes a sump 60 (i.e., a fluid collection mechanism) that interconnects the chassis 36 and the module stack 38. The sump 60 includes a passageway therethrough that is in fluid communication with the pump 32 shown in FIG. 1. The sump 60 also includes openings 62 through an upper side thereof and adjacent to the passageway and is made of an insulating material, such as molded plastic.

As shown, the module stack 38 is mounted to the sump 60, and the atomizer 40 is connected to the housing 34 above the module stack 38. Also similar to the embodiment shown in FIG. 3, the sump 60 forms an insulator (or insulating region) 52 between the module stack 38 and the chassis 36. The thickness 53 of the sump 60 may vary depending on the particular materials of which the sump 60 is made. It should again be noted that the embodiment shown in FIG. 4 does not include a heat sink, particularly interconnecting the module stack 38 and the chassis 36.

During operation, in a manner similar to that described above, fluid from the radiator 26 is sprayed from the atomizer 40 onto the microelectronic die 46 to remove heat from the microelectronic die 46. After the fluid falls from the module stack 38, the fluid drains from the module chamber 42 through the openings 62 and into the passageway in the sump 60. The fluid then flows through the passageway in the sump 60 and is returned to the radiator 26.

Still referring to FIG. 4, as the microelectronic die 46 is operated, due to the lack of conductive components, such as a heat sink, between the module stack 38 (or the microelectronic die 46) and the chassis 36, the capacitance 58 between the microelectronic die 46 and the chassis 36 is minimized.

Figure 5:
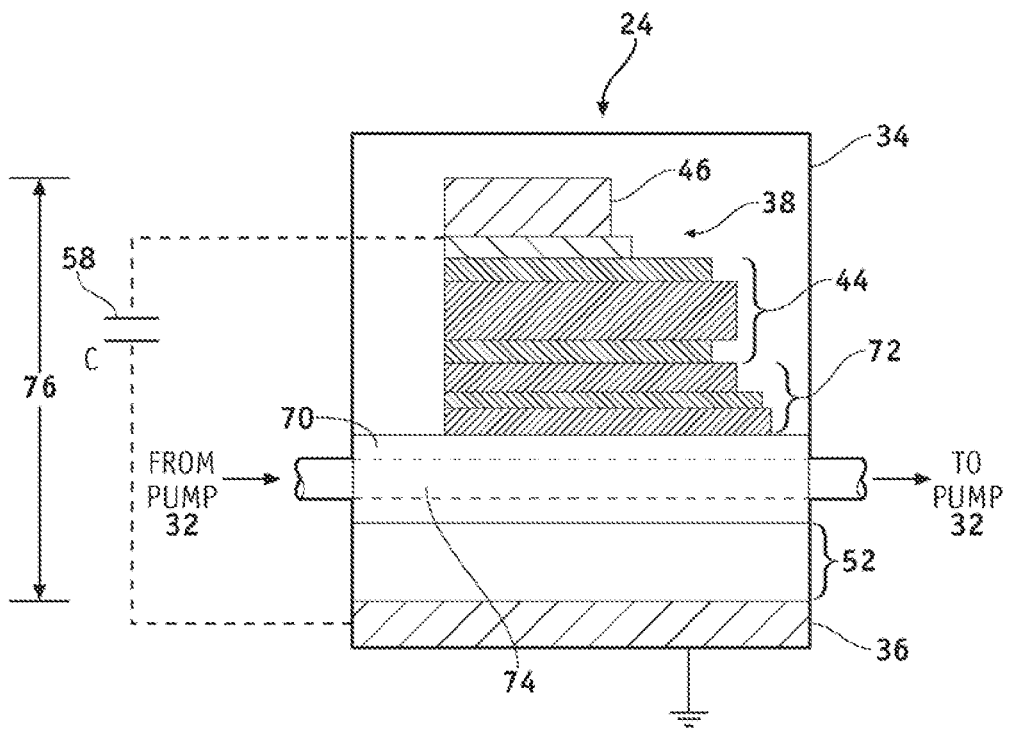
FIG. 5 is a cross-sectional side view of the inverter of FIG. 2, according to a further embodiment of the present invention.

FIG. 5 illustrates the inverter 24, according to a further embodiment. Similarly to the inverters 24 shown in FIGS. 3 and 4, the inverter 24 of FIG. 5 includes a housing 34, a chassis 36, and a module stack 38. However, the inverter 24 shown in FIG. 5 also includes a "floating" heat sink 70 and a base plate 72. The floating heat sink 70 is connected to the housing 34 and positioned in a spaced relationship from the chassis 36 with the insulator (or insulating region) 52 being formed therebetween. The floating heat sink 70 is made of a conductive material, such as aluminum, and includes a passageway 74 therethrough that is in fluid communication with the pump 32 shown in FIG. 1. Although not shown in detail, in one embodiment, the base plate 72 includes a metal plate with a layer of solder on an upper surface thereof that interconnects the metal plate and the module stack 38 and a layer of thermal grease on a lower surface thereof that interconnects the metal plate and the floating heat sink 70. The floating heat sink 70 may be positioned such that the microelectronic die 46 lies a distance 76 from the chassis 36 of, for example, at least 100 mm, such as between 100 and 150 mm. The insulator 52 may include an air gap that extends between the chassis 36 and the floating heat sink 70.

During operation, heat generated by the microelectronic die 46 conducts through the DBC substrate 44 and the base plate 72 and into the floating heat sink 70. Fluid from the radiator 26 is circulated through the passageway 74 in the floating heat sink 70 to absorb the heat conducted from the microelectronic die 46.

Still referring to FIG. 5, as the microelectronic die 46 is operated, due to the lack of direct connection and the air gap, as well as the relatively large distance, between the module stack 38 (or the microelectronic die 46) and the chassis 36, the capacitance 58 between the microelectronic die 46 and the chassis 36 is minimized.

One advantage of the various embodiments described above is that because of the reduced capacitance between the chassis and the microelectronic die, capacitive coupling between the die and the chassis is reduced, as is any electromagnetic interference caused by the operation of the die. Thus, the performance on the inverter is improved. As a result, the likelihood that Y-capacitors will have to be installed at the input of the inverter 24 is reduced, thereby reducing the manufacturing costs of the inverter.

Other embodiments may combine the features shown separated in FIGS. 3, 4, and 5. For example, the air gap shown in FIGS. 3 and 5 may be combined with the sump 60 shown in FIG. 4 to provide an inverter with an insulating body (i.e., the sump 60) and an air gap between the chassis 36 and the microelectronic die 46. The power inverter may also be utilized the in different types of automobiles, or in different electrical systems altogether.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. An automotive power inverter comprising:
a chassis;
a microelectronic die coupled to the chassis having a plurality of power electronic switches formed thereon;
an insulating region having a thickness of at least 1 mm between the chassis and the microelectronic die; and
a cooling mechanism to remove heat from the microelectronic die, the cooling mechanism being electrically insulated from the chassis.

2. The automotive power inverter of claim 1, wherein the microelectronic die generates a heat flux density of at least 10 W/cm2.

3. The automotive power inverter of claim 2, wherein the cooling mechanism does not include a heat sink directly connected to the chassis.

4. The automotive power inverter of claim 3, wherein the insulating region comprises at least one of an air gap and an insulating body.

5. The automotive power inverter of claim 4, further comprising a housing connected to the chassis, the housing comprising an insulating material and forming a chamber, the microelectronic die being positioned within the chamber.

6. The automotive power inverter of claim 5, wherein the cooling mechanism comprises a nozzle connected to the housing to direct a cooling fluid onto the microelectronic die to remove at least some of the heat from the microelectronic die.

7. The automotive power inverter of claim 6, wherein said automotive power inverter does not include a heat sink.

8. An automotive power inverter comprising:
a chassis comprising a conductive material;
an insulating housing connected to the chassis and forming a chamber;
a microelectronic die connected to the housing within the chamber, the microelectronic die having an integrated circuit formed thereon;
a nozzle connected to the housing within the chamber and directed at the microelectronic die to spray a cooling fluid onto the microelectronic die to remove heat from the microelectronic die during operation thereof, wherein the nozzle is electrically insulated from the chassis; and
an insulating region between the chassis and the microelectronic die.

9. The automotive power inverter of claim 8, wherein the insulating region comprises at least one of an air gap and an insulating body.

10. The automotive power inverter of claim 9, wherein said automotive power inverter does not include a heat sink.

11. An automotive drive system comprising:
a direct current (DC) power supply;
an electric motor coupled to the DC power supply; and
a power inverter coupled to the electric motor and to the DC power supply to receive DC power from the DC power supply and provide alternating current (AC) power to the electric motor, the power inverter comprising:
a chassis comprising a conductive material;
a housing connected to the chassis, the housing comprising an insulating material and forming a chamber;
a microelectronic die connected to the housing within the chamber, the microelectronic die having an integrated circuit with at least one transistor formed thereon;
a nozzle connected to the housing within the chamber and directed at the microelectronic die to spray a cooling fluid onto the microelectronic die to remove heat from the microelectronic die during operation thereof, wherein the nozzle is electrically insulated from the chassis; and
an insulating region between the chassis and the microelectronic die.

12. The automotive drive system of claim 11, further comprising a radiator coupled to the inverter to store the cooling fluid.

13. The automotive drive system of claim 12, wherein the insulating region includes an air gap and wherein the microelectronic die is electrically insulated from the chassis.

14. The automotive drive system of claim 13, wherein the power inverter does not include a heat sink.

15. The automotive power inverter of claim 6, further comprising a fluid collection mechanism connected to the chassis to collect the cooling fluid and remove the cooling fluid from the chamber.

16. The automotive power inverter of claim 15, wherein the fluid collection mechanism comprises an insulating material.

17. The automotive power inverter of claim 7, wherein a distance between the chassis and the microelectronic die is at least 100 mm.

18. The automotive power inverter of claim 9, wherein the insulating region comprises an air gap and an insulating body.

19. The automotive power inverter of claim 18, wherein the insulating body comprises a sump connected to the chassis to collect the cooling fluid and remove the cooling fluid from the chamber.

20. The automotive drive system of claim 13, further comprising a sump connected to the chassis to collect the cooling fluid and remove the cooling fluid from the chamber, the sump having a passageway therethrough, the passageway being in fluid communication with the radiator.

* * * * *